(12) United States Patent
Heng

(10) Patent No.: US 8,425,246 B1
(45) Date of Patent: Apr. 23, 2013

(54) LOW PROFILE SEMICONDUCTOR DEVICE SOCKET

(75) Inventor: Stephen F. Heng, Los Gatos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/308,861

(22) Filed: Dec. 1, 2011

(51) Int. Cl.
*H01R 13/625* (2006.01)

(52) U.S. Cl.
USPC ............................................ 439/342

(58) Field of Classification Search .................... 439/342
See application file for complete search history.

(56) References Cited

U.S. PATENT DOCUMENTS

| | | | |
|---|---|---|---|
| 4,918,513 A | 4/1990 | Kurose et al. | |
| 5,256,080 A | 10/1993 | Bright | |
| 6,011,304 A | 1/2000 | Mertol | |
| 6,340,309 B1 * | 1/2002 | Lin et al. | 439/342 |
| 6,537,096 B2 * | 3/2003 | Szu et al. | 439/342 |
| 6,654,250 B1 | 11/2003 | Alcoe | |
| 6,729,896 B2 * | 5/2004 | Huang | 439/342 |
| 6,743,026 B1 | 6/2004 | Brodsky | |
| 6,748,350 B2 | 6/2004 | Rumer et al. | |
| 6,848,172 B2 | 2/2005 | Fitzgerald et al. | |
| 6,848,610 B2 | 2/2005 | Liu | |
| 6,867,978 B2 | 3/2005 | Whittenburg et al. | |
| 6,870,258 B1 | 3/2005 | Too | |
| 6,882,535 B2 | 4/2005 | Labanok et al. | |
| 6,924,170 B2 | 8/2005 | Ravi et al. | |
| 6,934,154 B2 | 8/2005 | Prasher et al. | |
| 6,936,501 B1 | 8/2005 | Too et al. | |
| 6,987,317 B2 | 1/2006 | Pike | |
| 6,989,586 B2 | 1/2006 | Agraharam et al. | |
| 7,009,289 B2 | 3/2006 | Hu et al. | |
| 7,012,011 B2 | 3/2006 | Chrysler et al. | |
| 7,014,093 B2 | 3/2006 | Houle et al. | |
| 7,015,073 B2 | 3/2006 | Houle et al. | |
| 7,344,919 B2 | 3/2008 | McAllister et al. | |
| 7,442,049 B2 | 10/2008 | Hougham et al. | |
| 7,544,542 B2 | 6/2009 | Too et al. | |
| 7,661,976 B2 * | 2/2010 | Ma | 439/342 |
| 2001/0036063 A1 | 11/2001 | Nagaya et al. | |
| 2002/0176229 A1 | 11/2002 | Derian et al. | |
| 2003/0214800 A1 | 11/2003 | Dibene, II et al. | |
| 2004/0005800 A1 * | 1/2004 | Hou | 439/342 |
| 2004/0009682 A1 | 1/2004 | Suzuki et al. | |
| 2007/0072450 A1 | 3/2007 | McAllister et al. | |
| 2008/0227310 A1 | 9/2008 | Too et al. | |
| 2011/0273858 A1 | 11/2011 | Heng et al. | |

OTHER PUBLICATIONS

U.S. Appl. No. 13/311,956, filed Dec. 6, 2011, Heng et al.
USPTO Office Action notification date Jun. 8, 2012; U.S. Appl. No. 12/774,780.
USPTO Office Action notification date Dec. 7, 2012; U.S. Appl. No. 12/774,780.

* cited by examiner

*Primary Examiner* — Gary F. Paumen
(74) *Attorney, Agent, or Firm* — Tiimothy M. Honeycutt

(57) ABSTRACT

Various circuit board sockets and methods of manufacturing and using the same are disclosed. In one aspect, a method of manufacturing is provided that includes forming a socket operable to receive a first circuit board. The socket includes a housing and a cover slidedly coupled to the housing. The cover has an opening sized to enable the first circuit board to seat on the housing.

20 Claims, 6 Drawing Sheets

LOW PROFILE SEMICONDUCTOR DEVICE SOCKET

BACKGROUND OF THE INVENTION

1. Field of the Invention

This invention relates generally to semiconductor processing, and more particularly to sockets useful with, for example, circuit boards, and to methods of making and using the same.

2. Description of the Related Art

In various types of electronic systems, microprocessors and sometimes other types of integrated circuits are often connected to some form of larger printed circuit board, such as a motherboard, daughterboard or other type of a printed circuit board. In some cases, the integrated circuit is connected to the motherboard by direct soldering or other direct mounting techniques. In other cases, a socket is provided on the upper surface of the motherboard that is designed to receive the integrated circuit. For those integrated circuits that consist of some type of package enclosure and some plurality of conductor pins that project from the package, the motherboard socket includes a corresponding plurality of individual socket cavities that are arranged spatially to match up with corresponding conductor pins on the integrated circuit package.

In one conventional socket design used for packaged semiconductor chips that utilize a package substrate consists of a rectangular housing mounted to a system board. A cover is slidedly mounted on the housing and consists of a fortress-like structure that has four walls interconnected at four corners. The four walls enclose an interior space that has a bottom surface provided with a plurality of the aforementioned individual socket cavities spatially arranged to receive respective conductor pins of the package substrate. Since the package substrate seats on the cover, the overall vertical profile of the combination of the socket and the packaged device is dictated by the height of the cover and the height of the combination of the package substrate and a chip mounted thereon or a package lid if present. The vertical profile must be accommodated spatially by whatever device, i.e., computer, handset, etc. that houses the socket and packaged device.

The quest for thinness in the computers and handset industries is ongoing. Lower vertical profiled sockets and package devices can result in thinner computers and handsets. However, reducing the vertical profile of a socket and package device mounted therein is not a trivial matter. One conventional technique involves thinning the semiconductor chip or package substrate or both. However, such techniques may introduce other issues, such as die cracking or package substrate warping.

The present invention is directed to overcoming or reducing the effects of one or more of the foregoing disadvantages.

SUMMARY OF EMBODIMENTS OF THE INVENTION

In accordance with one aspect of embodiments of the present invention, a method of mounting a first circuit board is provided. The method includes placing the first circuit board in a socket. The socket includes a housing and a cover slidedly coupled to the housing. The cover has an opening sized to enable the first circuit board to seat directly on at least a portion of the housing. The first circuit board is secured to the socket.

In accordance with another aspect of embodiments of the present invention, a method of manufacturing is provided that includes forming a socket operable to receive a first circuit board. The socket includes a housing and a cover slidedly coupled to the housing. The cover has an opening sized to enable the first circuit board to seat directly on at least a portion of the housing.

In accordance with another aspect of embodiments of the present invention, a method of operating an electronic device is provided that includes placing a first circuit board in a socket. The first circuit board includes a semiconductor chip electrically connected to the socket. The socket is positioned in the electronic device and includes a housing and a cover slidedly coupled to the housing. The cover has an opening sized to enable the first circuit board to seat directly on at least a portion of the housing. Electronic operations are performed with the semiconductor chip.

In accordance with another aspect of embodiments of the present invention, an apparatus is provided that includes a socket operable to receive a circuit board. The socket includes a housing and a cover slidedly coupled to the housing. The cover has an opening sized to enable the first circuit board to seat directly on at least a portion of the housing.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various sockets useful with, for example, circuit boards are disclosed. In one aspect, a socket is disclosed that is operable to be mounted on a circuit board and, in-turn, receive a semiconductor chip device, such as a semiconductor chip package. The socket includes a housing and a cover slidedly coupled to the housing. The cover has an opening sized to enable the first circuit board to seat on the housing. Additional details will now be described.

Figure 1:
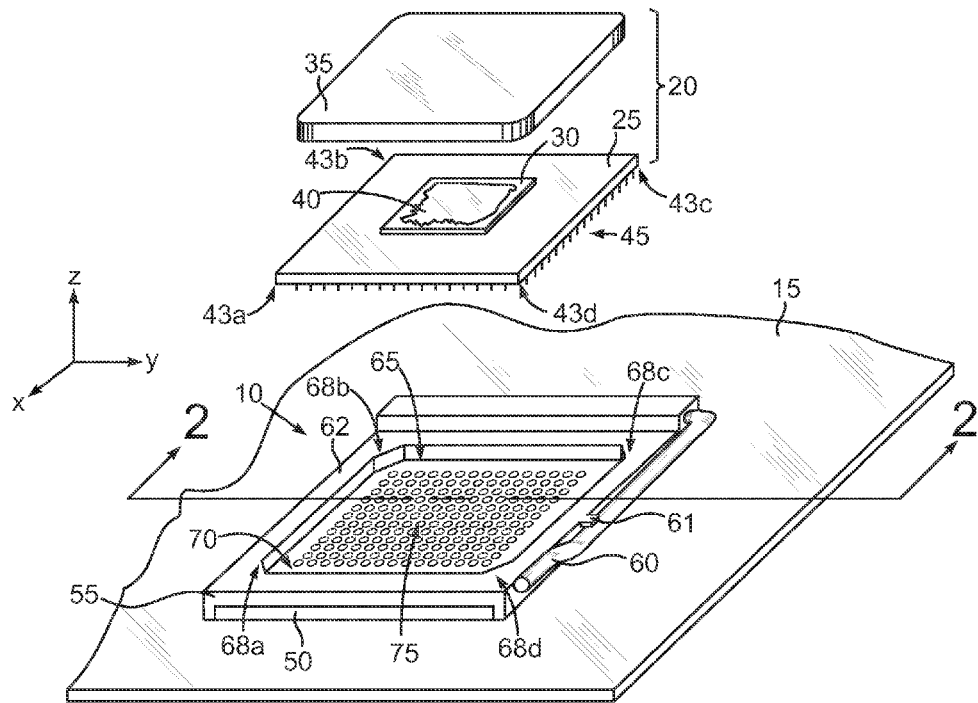
FIG. 1 is a partially exploded pictorial view of an exemplary conventional semiconductor chip socket mounted on a printed circuit board.

In the drawings described below, reference numerals are generally repeated where identical elements appear in more than one figure. Turning now to the drawings, and in particular to FIG. 1 is a partially exploded pictorial view of an exemplary conventional socket 10 that is mounted on a printed circuit board 15. The socket 10 is designed to receive a PGA package 20 consisting of a PGA substrate 25, a semiconductor die 30 mounted on the PGA substrate 25 and a lid 35 that is mounted to the PGA substrate 25 and covers the semiconductor die 30. A thermal interface material 40, such as a thermal grease or paste, is positioned on the semiconductor die 30 to establish thermal contact with a lower surface (not shown) of the lid 35. The PGA substrate 25 includes four corners 43a, 43b, 43c and 43d and a plurality of PGA conductor pins 45. The socket 10 includes a socket housing 50 that is mounted to the circuit board 15 by way of plural solder structures which are not visible in FIG. 1 but will be shown in subsequent figures. A socket cover 55 is slidedly mounted on the socket housing 50 and movable along the x-axis by way of a cam lever 60, which is pivotable generally in the x-z plane and which is shown in the locked down position in FIG. 1. The cam lever 60 is held down in a locked position by the tab 61 projecting laterally from the socket cover 55. The socket cover 55 includes an upper surface 62 and a generally octagonal opening 65 that defines corner portions 68a, 68b, 68c and 68d of the upper surface 62. The opening 65 terminates along the z-axis at a socket cover floor 70 that is populated by a plurality of pin holes 75. To mount the PGA package 20 in the socket 10, the cam lever 60 is pivoted upward in the x-z plane. Next, the corners 43a, 43b, 43c and 43d of the PGA substrate 25 are seated on the corner portions 68a, 68b, 68c and 68d, respectively, and perhaps a thin portion of the upper surface 62 of the socket cover 55 that borders the opening 65 so that the PGA pins 45 project through the opening 65 and enter corresponding of the pin holes 75. At this point, the cam lever 60 is moved downward through the x-z plane to precess the socket cover 55 and the PGA package 20 a small amount in the x-direction so that certain conductor structures within the socket housing (not visible) are engaged by the PGA pins 45.

Figure 2:
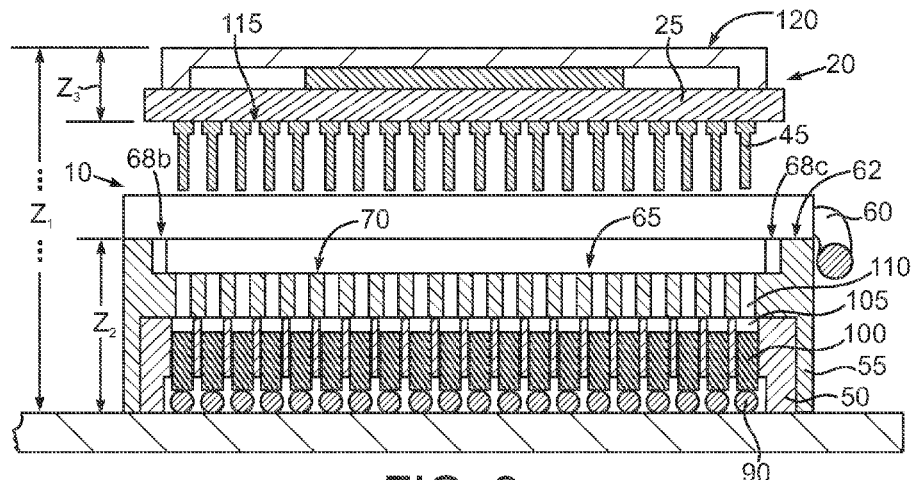
FIG. 2 is a sectional view of FIG. 1 taken at section 2-2.

Additional details of the conventional socket 10 may be understood by referring now also to FIG. 2, which is a sectional view of FIG. 1 taken at section 2-2. Due to the location of section 2-2, only a portion of the cam lever 60 is visible and the corner portions 68a and 68d of the socket cover 55 are not visible. Here, the package 20 is shown exploded from the socket 10 but not otherwise exploded as is the case in FIG. 1. As noted above, the socket cover 55 and in particular the opening 65 is sized so that the PGA package 20 and in particular the package substrate 25 will seat on among others, the corner portions 68b and 68c (and 68a and 68d not visible in FIG. 2) and perhaps a thin portion of the upper surface 62, and not seat down inside of the opening 65 and on the floor 70 of the socket cover 55. As noted briefly in conjunction with FIG. 1, the socket housing 50 is coupled physically and electrically to the circuit board 15 by way of plural solder structures 90, which are typically solder balls. The solder balls 90 are metallurgically bonded to respective contacts 100 which are positioned in cavities 105 of the socket housing 50. The cavities 100 are vertically aligned with corresponding of the pin holes 75 in the socket cover 55. During seating, the PGA package 20 is lowered along the z-axis so that the pins 45 project through the combination of the cavities 110 and 105 and project through the contacts 100 in a zero insertion force "ZIF" arrangement. The structure that enables the ohmic contact between the pins 45 and the contacts 100 is not visible in FIG. 2, but will be shown in FIG. 3. Still referring to FIG. 2, after the PGA package 20 is positioned vertically so that the pins 45 project through and into the contacts 100, the cam lever 60 is manipulated as discussed above to move the socket cover 55 and thus the package and pins 45 out of the page along the x-axis to establish the ohmic contact with the contacts 100.

As noted in the Background Section a lid of a conventional packaged chip will have some elevation above a system board. Since the socket cover 55 is designed to seat the package 20 on the upper surface 62, the top 120 of the lid 35 will have some elevation $z_1$ above the circuit board 15 that is the sum of the elevation $z_2$ of the upper surface 62 of the socket cover 55 relative to the circuit board 15 and the distance $z_3$ between the bottom 115 of the package substrate 25 and the top 120 of the lid 35.

The structure of the contacts 100 depicted in FIG. 2 will now be described in conjunction with FIG. 3, which is a pictorial view of one of the contacts 100, one of the solder balls 90, one of the PGA pins 45 and a small portion of the package substrate 25 removed from the other features shown in FIG. 2. The contact 100 includes an elongated body 120 composed of a conductive material, such as brass or copper that has a C-spring 125 positioned at an upper end and a small solder tab 130 positioned at a lower end. The C-spring has a diameter that is much larger than the outer diameter of the pin 45 to facilitate ZIF operation. The solder tab 130 is designed to metallurgically bond to the solder ball 90. When the package substrate 25 is first seated and before the cam lever 60 is operated, the pin 45 projects through the C-spring 125 but without snug engagement. Thereafter, when the cam lever 60 is actuated, the package substrate 25 and the pin 45 are translated along the x-axis so that the pin 45 is pinched between the opposing faces of the C-spring 125 to establish an ohmic connection.

Figure 4:
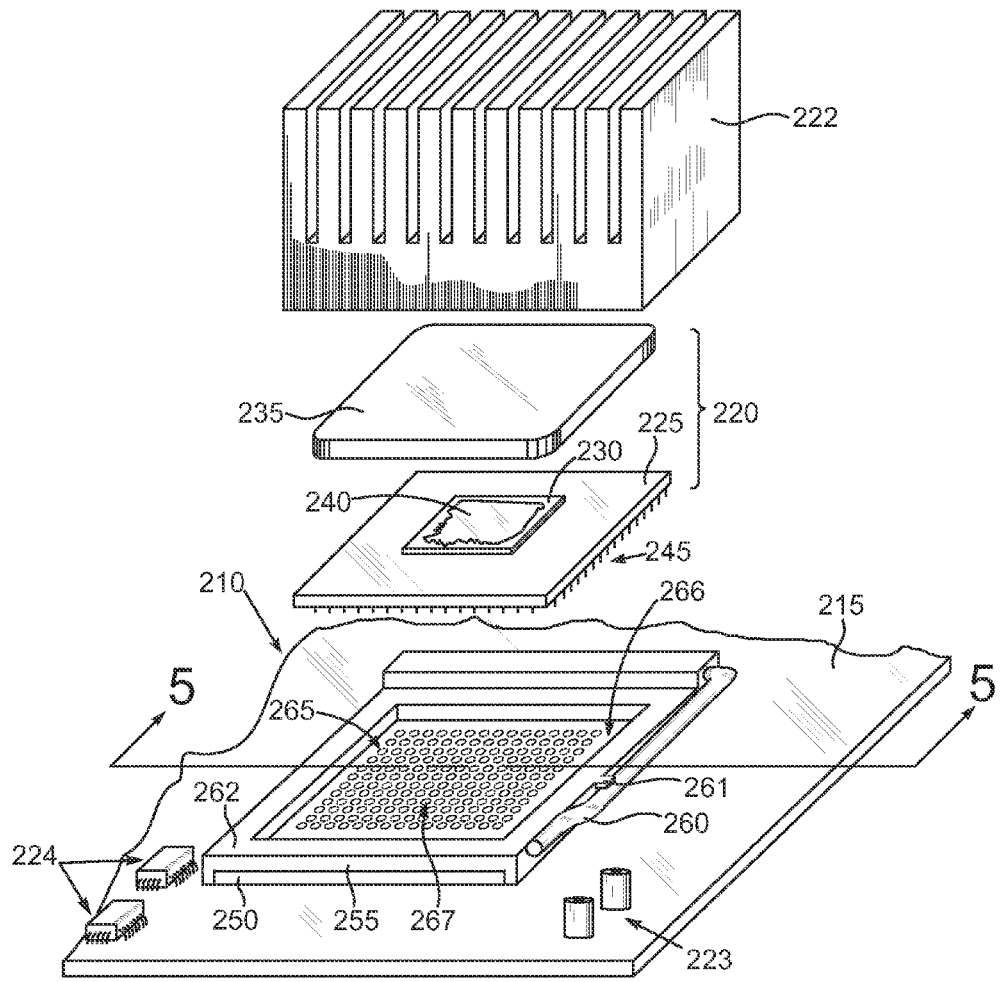
FIG. 4 is a partially exploded pictorial view of an exemplary embodiment of a socket which may be mounted to a circuit board and used to electrically connect a semiconductor chip device.

Attention is now turned to FIG. 4, which is a partially exploded pictorial view of an exemplary embodiment of a socket 210 which may be mounted to a circuit board 215 and used to electrically connect a semiconductor chip device 220. Here, the semiconductor chip device 220 and an optional heat sink 222 are shown exploded from the socket 210 and the circuit board 215. The semiconductor chip device 220 may include a circuit board 225, one or more semiconductor chips 230 mounted thereon and an optional heat spreader or lid 235 which may be mounted to the circuit board 225. The socket 210 may be used as an interface for a myriad of different types of circuit boards and semiconductor chips. For example, the circuit board 225 may be a semiconductor chip package substrate, a circuit card, a pinned socket adapter, or virtually any other type of printed circuit board. Although a monolithic structure could be used for the circuit board 225, a more typical configuration will utilize a build-up design. In this regard, the circuit board 225 may consist of a central core upon which one or more build-up layers are formed and below which an additional one or more build-up layers are formed. The core itself may consist of a stack of one or more layers. If implemented as a semiconductor chip package substrate, the number of layers in the circuit board 225 can vary from four to sixteen or more, although less than four may be used. So-called "coreless" designs may be used as well. The layers of the circuit board 225 may consist of an insulating material, such as various well-known epoxies, interspersed with metal interconnects. A multi-layer configuration other than buildup could be used. Optionally, the circuit board 225 may be composed of well-known ceramics or other materials suitable for package substrates or other printed circuit boards. The circuit board 225 may be provided with a number of conductor traces and vias and other structures (not visible) in order to provide power, ground and signals transfers between the semiconductor chip 230 and another device, such as the socket 210 for example. In this illustrative embodiment, the circuit board 225 is configured as a PGA package substrate and thus includes a downwardly facing array of pins or pin grid array 245 connected to the latent traces and vias.

The semiconductor chip 230 may be any of a large number of different types of circuit devices used in electronics, such as, for example, microprocessors, graphics processors, combined microprocessor/graphics processors, application specific integrated circuits, memory devices or the like, and may be single or multi-core or even stacked with or accompanied by additional dice. The semiconductor chip 230 may be constructed of bulk semiconductor, such as silicon or germanium, or semiconductor-on-insulator materials, such as silicon-on-insulator materials. The semiconductor chip 230 may be mounted to the circuit board 225 using solder bumps, conductive pillars with or without solder enhancement, wire bonds, combinations of these or other types of interconnects.

The circuit board 215 may be a system board, such as a motherboard, a circuit card, a semiconductor chip package substrate or virtually any other type of printed circuit board. Structurally speaking, the circuit board substrate 215 may use the same types of structures and materials as the circuit board 225. In addition to the socket 210, the circuit board may be populated with various other components, such as the capacitors 223 and the integrated circuits 224, to name just a few.

The optional lid 235 may be a bathtub design as depicted, a top hat design or some other configuration as desired. The lid 235 may be composed of well-known ceramics or metallic materials as desired. Some exemplary materials include nickel plated copper, anodized aluminum, aluminum-silicon-carbon, aluminum nitride, boron nitride or the like. The lid 235 may be secured to the circuit board 225 by an adhesive composed of a well-known thixotropic adhesive, an epoxy, another type of polymer or even a solder.

The socket 210 includes a socket housing 250 that is mounted to the circuit board 215 by way of plural solder structures or otherwise which are not visible in FIG. 4 but will be shown in subsequent figures. A socket cover 255 is slidedly mounted on the socket housing 250 and movable along the x-axis by way of a cam lever 260. The cam lever 260 may be held down in a locked position by the tab 261 projecting laterally from the socket cover 255. Unlike the conventional socket cover 255 depicted in FIGS. 1 and 2, the socket cover 255 of this illustrative embodiment includes an upper surface 262 and opening 265 that extends down to and exposes an upper surface 266 of the socket housing 250. In this illustrative embodiment, the opening 265 of the socket cover 255 may be generally rectangular as shown. However, the skilled artisan will appreciate that many other shapes may be used. The upper surface 266 of the socket housing 250 is populated by an array of pin cavities 267, which may be substantially identical to the cavities 105 depicted in FIG. 2. Thus, the opening 265 is sized so that the circuit board 225 may seat on the upper surface 266 of the socket housing 250 as opposed to seating on the upper surface 262 of the socket cover 255.

Figure 5:
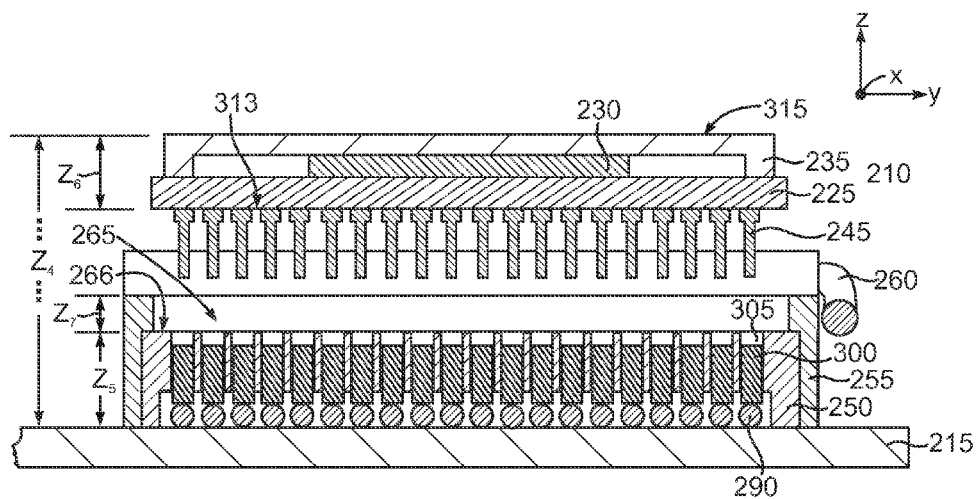
FIG. 5 is a sectional view of FIG. 4 taken at section 5-5.

Additional details of the socket 210 may be understood by referring now also to FIG. 5, which is a sectional view of FIG. 4 taken at section 5-5. In FIG. 5, the semiconductor chip device 220 is shown unexploded, thus the lid 235 is mounted to the package substrate 225 and in thermal contact with the semiconductor die 230. However the device 220 is shown exploded from the socket 210. Note that due to the location of section 5-5, only a portion of the cam lever 260 is visible. As noted above, the socket housing 250 may be secured to the circuit board 215 by way of plural solder structures 290 that are coupled to corresponding contacts 300. The solder structures 290 and contacts 300 may be substantially identical to the solder balls 90 and contacts 100 described elsewhere herein and depicted in FIGS. 2 and 3. Optionally, other interconnects, such as land grid arrays, compression fits or others may be used. The socket housing 250 also includes plural cavities 305 in which the contacts 300 are positioned and which are sized to receive the pins 245 of the circuit board 225 in a ZIF mode. The cavities 305 may have a circular, rectangular or other footprint. As noted above, the opening 265 is sized so that the circuit board 225 may be seated therein and on the upper surface 266 of the socket housing 250. Prior to insertion, the cam lever 260 is rotated up through the x-z plane. At this point, the circuit board 225 may be dropped into the opening 265 and seat on the upper surface 266 of the socket housing 250 so that the pins 245 project through the cavities 305 and into the contacts 300 as described above, albeit it in the context of the contacts 100 and FIG. 3. Thereafter, the cam lever 260 may be rotated back down through the x-z plane and locked into position to advance the circuit board 225 and the pins 245 thereof out of the page along the x-axis to establish ohmic contact with the contacts 300. The post seating elevation $z_4$ of the upper surface 315 of the lid 235 above the circuit board 215 is defined by the sum of the elevation $z_5$ of the upper surface 266 of the socket housing 250 above the circuit board 215 plus the distance $z_6$ between a lower surface 313 of the circuit board 225 and the upper surface 315 of the lid 235. However, the value $z_4$, which represents a functional limit on the overall thickness of an electronic device in which the circuit board 215 and the semiconductor chip device 220 are mounted will be correspondingly smaller than the height $z_1$ associated with a conventional design depicted in FIGS. 1 and 2. This follows from the fact that the socket cover 250 is provided with the opening 265 that extends all the way to the upper surface 266 of the socket housing 250. Indeed the amount of height reduction will be $z_7$, which is the height of the socket cover 250 that projects above the upper surface 266 of the socket housing 250. The height reduction provides a shorter electrical path length and thus improved performance, and enhances the possibilities for low profile enclosures.

Figure 6:
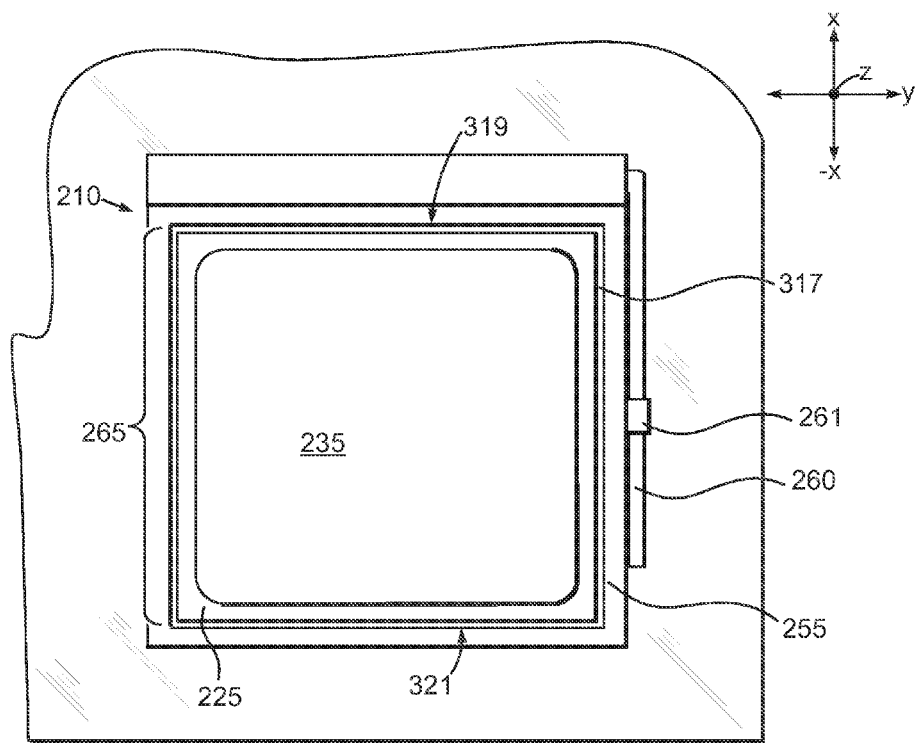
FIG. 6 is a plan view of the exemplary socket.

FIG. 6 is an overhead view of the socket 210 with the semiconductor chip device 220 seated therein but without any heat sink in place on the lid 235. The cam lever 260 is shown in the locked down position. The opening 265 in the socket cover 255 is sized to have a relatively close correspondence to the footprint of the circuit board 225. Thus, the gap 317 between the internal periphery of the socket cover 255 and the external periphery of the circuit board 225 is somewhat exaggerated in FIG. 6. At the time of insertion, the cam lever 260 is pivoted upward through the x-z plane and the circuit board 225 is dropped into the opening 265 as described above. At this point, the cam lever 260 is rotated down through the x-z plane. The camming action causes the edge 319 of the socket cover 255 facing the opening 265 to bear against the semiconductor chip package 225 and translate it along with the pins 245 shown in FIG. 5 in the x-direction to establish engagement with the contacts 300 shown in FIG. 5. At this point, the cam lever 260 is locked under the tab 261 as shown in FIG. 6. To unseat the semiconductor chip package 225, the processes are reversed so that the cam lever 260 is unclicked from the tab 261 and rotated up through the x-z plane so that the edge 321 of the socket cover 255 bears against the semiconductor chip package 225 translating it in the x-direction so that it may be lifted out.

Figure 3:
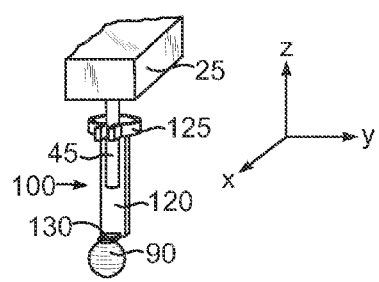
FIG. 3 is a pictorial view of a pin contact from the exemplary conventional semiconductor chip socket.
Figure 7:
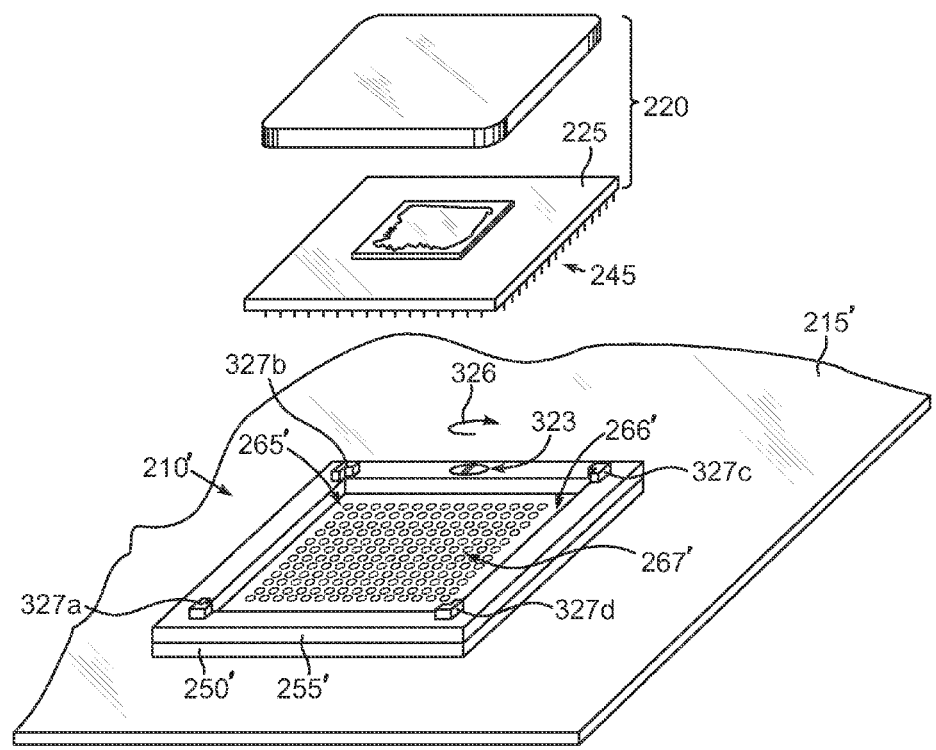
FIG. 7 is a partially exploded pictorial view of an alternate exemplary embodiment of a socket which may be mounted to a circuit board and used to electrically connect a semiconductor chip device.

In the foregoing illustrative embodiment, the relative movement between a socket cover and a socket housing is facilitated by a cam mechanism that is actuated by way of a lever, such as the lever 260 depicted in FIGS. 3, 4 and 5. However, the skilled artisan will appreciate that other mechanisms may be used to actuate a cam or other mechanism to facilitate sliding movement between two cooperating elements. In this regard, attention is now turned to FIG. 7, which is a pictorial view of a circuit board 215' and a socket 210' that may be configured as generally described elsewhere herein and depicted in FIGS. 3, 4 and 5 with a few exceptions. In this regard, the socket 210' may include a socket housing 250' and a socket cover 255' slidedly mounted thereon. The socket cover 255' may include an opening 265' that leads to an upper surface 266' of the socket housing 250' that is populated with plural cavities 267'. However, in order to facilitate the sliding movement, a screw head 323 may be secured to or integral with a cam mechanism (not shown) beneath the visible surface of the socket cover 255'. By turning the screw head 323 as suggested by the arrow 326, the socket cover 255' may be moved along the x-axis relative to the socket housing 250' in order to engage the PGA pins 245 or whatever interconnects that project downwardly from the circuit board 225. Such a screw-activated mechanism may be suitable in circumstances where the electronic device in which the circuit board 215' is mounted is relatively small and lacks sufficient clearance for the positioning and movement of a lever arm or other larger type of device that requires greater freedom of movement in order to operate. Another feature that may be used in this or any of the disclosed embodiments is a set of alignment features 327a, 327b, 327c and 327d positioned at the corners or elsewhere on the socket cover 255'. Here the alignment features 327a, 327b, 327c and 327d may consist of upwardly projecting elbow-shaped walls. The alignment features 327a, 327b, 327c and 327d are designed to provide guides for the circuit board 225 to facilitate ZIF movements.

Figure 8:
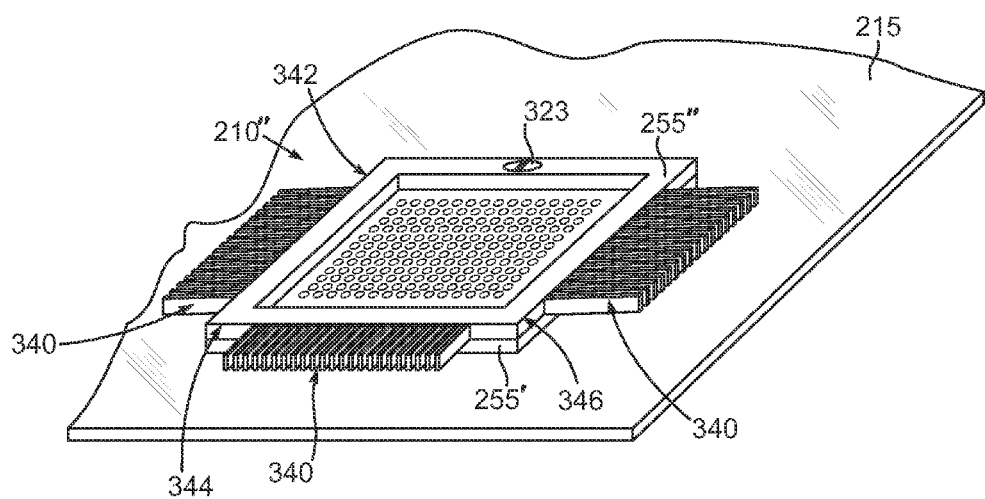
FIG. 8 is pictorial view of an alternate exemplary embodiment of a socket which may be mounted to a circuit board and used to electrically connect a semiconductor chip device.

The socket housing 250 and the socket cover 255 may be composed of a variety of electrically insulating materials, such as liquid crystal polymer, fiberglass resin materials, well-known plastics or the like. In addition, because the disclosed exemplary socket covers 255, 255' and others do not require any electrical contact with the pins or other conductor structures of the circuit boards, such as the board 225, it may be possible to fabricate a socket cover from a metallic material that exhibits favorable heat transfer characteristics. In this regard, attention is now turned to FIG. 8, which is a pictorial view of an alternate exemplary embodiment of a socket 210" mounted to a circuit board 215", which may be configured substantially like the circuit board 215 described above. The socket 210" includes a socket housing 250' that may be configured substantially as described above and a socket cover 255" that may be composed of a metallic material or materials and fitted with a plurality of heat fins 340. The heat fins 340 may be positioned at sides 342, 344 and 346 of the socket cover 255". It may be more difficult to position them proximate the screw head 323. The heat fins 340 may be formed integrally with the socket cover 255" or affixed thereto by soldering or other metal fastening techniques as desired, and may be virtually any shape. A variety of materials may be used such as copper, aluminum, nickel, stainless steel, combinations of these or the like. It should be understood that any of the disclosed embodiments may be fitted with such heat fins regardless of the mechanism for providing a sliding movement of the socket cover 255". An advantage of providing the socket cover 255" with heat dissipation devices such as the fins 340 is that the socket 210 may be capable of carrying higher current and thus rated for higher current devices.

Figure 9:
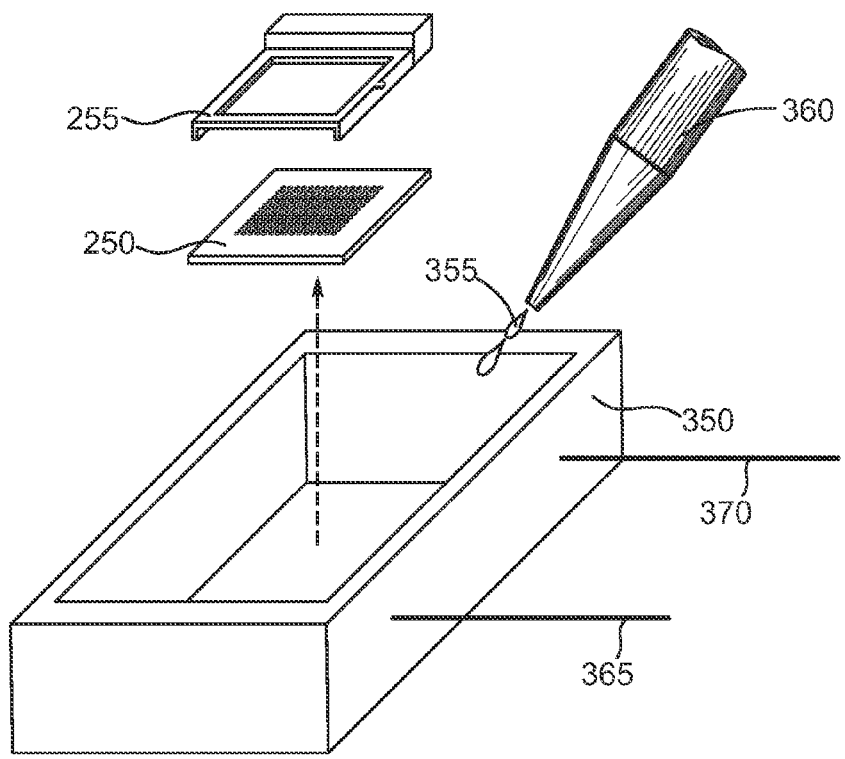
FIG. 9 is a schematic pictorial view of an exemplary molding apparatus that may be used to fabricate exemplary sockets.

A variety of techniques may be used to manufacture the socket housing and socket cover for any of the disclosed embodiments. For example, and as depicted in FIG. 9 a suitable mold 350 may be injected with a moldable material 355 by way of an applicator 360 or by way of supply and return lines 365 and 370 in order to create, for example, the socket housing 250 and the socket cover 255. The molding process may be thermoplastic, thermosetting or some other process. Vacuum conditions may be desirable to enhance structural uniformity. Discrete molding operations may be appropriate for fabricating the socket housing 250 and the socket cover 255. Optionally, machining or other well-known material shaping techniques could be used. Metal materials might be cast, forged or otherwise constructed.

Figure 10:
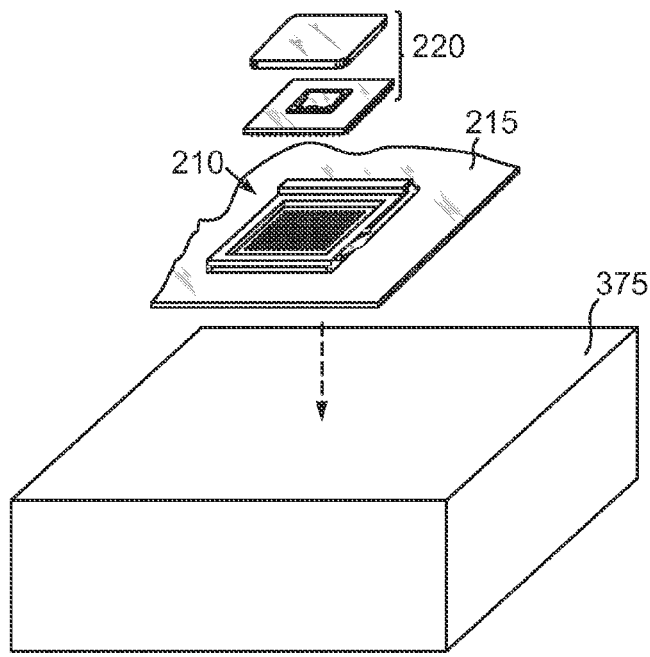
FIG. 10 is a partially exploded pictorial view and schematic view depicting mounting of an exemplary socket and semiconductor chip device in another electronic device.
Figure 11:
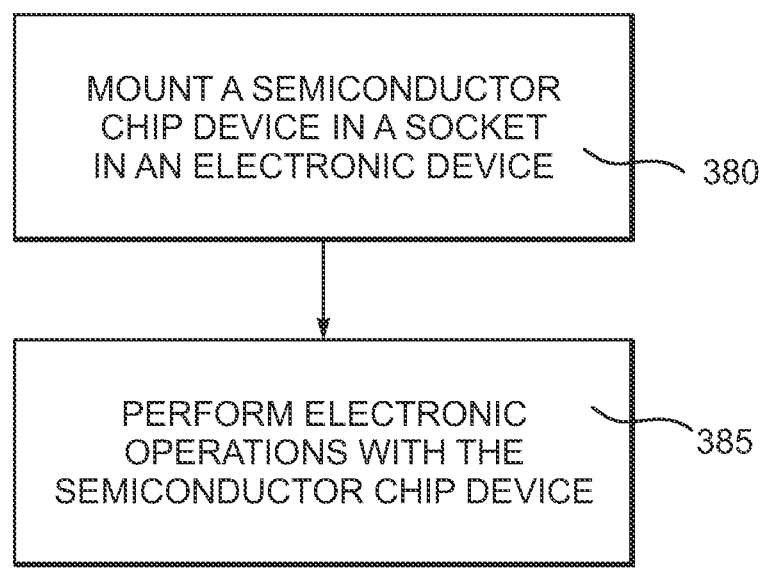
FIG. 11 is a flow chart describing exemplary mounting of an exemplary semiconductor chip device and performing electronic operations with that device.

Any of the disclosed embodiments of a circuit board, such as circuit boards 215, 215' and 215", may be coupled to an electronic device and used to perform electronic operations. FIG. 10 depicts a pictorial view of the socket 210, circuit board 215 and the semiconductor chip device 220 inserted into a schematically represented electronic device 375. Here, the electronic device 375 may be a computer, a server, a hand held device, or virtually any other electronic component. The circuit board 215 may be fitted in the electronic device 375 and secured thereto by screws, rivets, clamps, adhesives or any other available fastening method. The semiconductor chip device 220 may be seated therein as disclosed generally herein. As shown in FIG. 11, at step 380 the semiconductor chip device 220 may be mounted to the socket 210 in an electronic device. At step 385, electronic operations may be performed by the semiconductor chip device 220. The electronic operations may be virtually any operations performed by integrated circuits.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of mounting a first circuit board, comprising:
placing the first circuit board in a socket, the socket including a housing and a cover slidably coupled to the housing, the cover having an opening sized to enable the first circuit board to seat directly on at least a portion of the housing; and
securing the first circuit board to the socket.

2. The method of claim 1, wherein the socket is coupled to a second circuit board.

3. The method of claim 1, wherein the housing comprises plural socket cavities and the circuit board comprises plural conductor pins to penetrate at least some of the socket cavities.

4. The method of claim 1, wherein the step of securing the circuit board comprises sliding the socket cover relative to the socket housing.

5. The method of claim 1, comprising coupling plural heat fins to the cover.

6. The method of claim 1, comprising mounting a semiconductor chip to the first circuit board.

7. A method of manufacturing, comprising:
forming a socket operable to receive a first circuit board, the socket including a housing and a cover slidably coupled to the housing, the cover having an opening sized to enable the first circuit board to seat directly on at least a portion of the housing.

8. The method of claim 7, comprising coupling the socket to a second circuit board.

9. The method of claim 7, wherein the socket housing and cover are formed by molding a polymer.

10. The method of claim 7, wherein the housing comprises plural socket cavities operable to receive corresponding plural conductor pins of the first circuit board.

11. The method of claim 7, comprising coupling a lever or screw head to the socket wherein movement of the lever or the screw head produces sliding movement of the socket cover.

12. A method of operating an electronic device, comprising:
    placing a first circuit board in a socket, the first circuit board including a semiconductor chip electrically connected to the socket, the socket positioned in the electronic device and including a housing and a cover slidably coupled to the housing, the cover having an opening sized to enable the first circuit board to seat directly on at least a portion of the housing; and
    performing electronic operations with the semiconductor chip.

13. The method of claim 12, wherein the socket is coupled to second circuit board positioned in the electronic device.

14. An apparatus, comprising:
    a socket operable to receive a circuit board, the socket including a housing and a cover slidably coupled to the housing, the cover having an opening sized to enable the first circuit board to seat directly on at least a portion of the housing.

15. The apparatus of claim 14, comprising a second circuit board upon which the socket is mounted.

16. The apparatus of claim 15, wherein the second circuit board comprises a system board.

17. The apparatus of claim 14, comprising a lever or screw head coupled to the socket wherein movement of the lever or the screw head produces sliding movement of the cover.

18. The apparatus of claim 14, wherein the housing comprises plural socket cavities operable to receive corresponding plural conductor pins of the first circuit board.

19. The apparatus of claim 14, comprising an electronic device coupled to socket.

20. The apparatus of claim 14, comprising plural heat fins coupled to the cover.

\* \* \* \* \*